(12) United States Patent
Hsieh et al.

(10) Patent No.: US 9,825,224 B2
(45) Date of Patent: Nov. 21, 2017

(54) RRAM DEVICE

(71) Applicant: Taiwan Semiconductor Manufacturing Co., Ltd., Hsin-Chu (TW)

(72) Inventors: Ching-Pei Hsieh, Kaoshiung (TW); Chung-Yen Chou, Hsinchu (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/233,028

(22) Filed: Aug. 10, 2016

(65) Prior Publication Data

US 2016/0351806 A1 Dec. 1, 2016

Related U.S. Application Data

(62) Division of application No. 14/713,213, filed on May 15, 2015, now Pat. No. 9,431,603.

(51) Int. Cl.
*H01L 45/00* (2006.01)
*H01L 27/24* (2006.01)

(52) U.S. Cl.
CPC ...... *H01L 45/1691* (2013.01); *H01L 27/2436* (2013.01); *H01L 45/04* (2013.01); *H01L 45/085* (2013.01); *H01L 45/124* (2013.01); *H01L 45/1233* (2013.01); *H01L 45/1266* (2013.01);

(Continued)

(58) Field of Classification Search
CPC ............... H01L 45/124; H01L 27/2436; H01L 45/1253; H01L 45/1675; H01L 45/08; H01L 45/149
See application file for complete search history.

(56) References Cited

U.S. PATENT DOCUMENTS 7,482,616 B2 * 1/2009 Song .................. H01L 29/7843
257/2
9,209,392 B1 12/2015 Sung et al.
(Continued)

OTHER PUBLICATIONS

Notice of Allowance dated Apr. 28, 2016 for U.S. Appl. No. 14/713,213.

*Primary Examiner* — David Vu
(74) *Attorney, Agent, or Firm* — Eschweiler & Potashnik, LLC

(57) ABSTRACT

The present disclosure relates to an integrated circuit device having an RRAM cell, and an associated method of formation. In some embodiments, the integrated circuit device has a bottom electrode disposed over a lower metal interconnect layer. The integrated circuit device also has a resistance switching layer with a variable resistance located on the bottom electrode, and a top electrode located over the resistance switching layer. The integrated circuit device also has a self-sputtering spacer having a lateral portion that surrounds the bottom electrode at a position that is vertically disposed between the resistance switching layer and a bottom etch stop layer and a vertical portion abutting sidewalls of the resistance switching layer and the top electrode. The integrated circuit device also has a top etch stop layer located over the bottom etch stop layer abutting sidewalls of the self-sputtering spacer and overlying the top electrode.

20 Claims, 8 Drawing Sheets

(52) U.S. Cl.
CPC ...... *H01L 45/1675* (2013.01); *H01L 45/1253* (2013.01); *H01L 45/149* (2013.01)

(56) References Cited

U.S. PATENT DOCUMENTS

| | | | |
|---|---|---|---|
| 2003/0047727 A1* | 3/2003 | Chiang | H01L 45/06 257/3 |
| 2009/0166609 A1* | 7/2009 | Schricker | B82Y 10/00 257/40 |
| 2012/0224413 A1 | 9/2012 | Zhang et al. | |

* cited by examiner

RRAM DEVICE

REFERENCE TO RELATED APPLICATION

This Application is a Divisional of U.S. application Ser. No. 14/713,213 filed on May 15, 2015, the contest of which is hereby incorporated by reference in its entirety.

BACKGROUND

Many modern electronic devices contain electronic memory configured to store data. Electronic memory may be volatile memory or non-volatile memory. Non-volatile memory is able to store data in the absence of power, whereas volatile memory is not Resistive random access memory (RRAM) is one promising candidate for next generation non-volatile memory technology due to its simple structure and its compatibility with complementary metal-oxide-semiconductor (CMOS) logic fabrication processes. AN RRAM cell includes a "MIM" structure having an insulated layer with a variable resistance corresponding to the voltage applied, which is placed between two electrodes disposed within interconnect metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
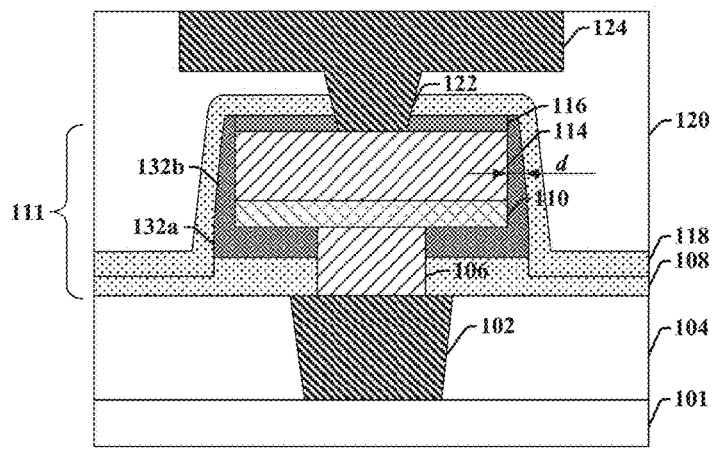
FIG. 1 illustrates a cross-sectional view of some embodiments of an integrated circuit device including a resistive random access memory (RRAM) cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) cells include a data storage layer placed between two electrodes. Depending on voltages applied to the electrodes, the data storage layer will undergo a reversible change between a high resistance state associated with a first data state (e.g., a '0' or 'RESET') and a low resistance state associated with a second data state (e.g., a '1' or 'SET'). Once a resistance state is set, an RRAM cell will retain the resistive state until another voltage is applied to induce a RESET operation (resulting in a high resistance state) or a SET operation (resulting in a low resistance state).

RRAM cells are typically formed by a process in which a sidewall spacer is formed to surround a top electrode after patterning of the top electrode. The sidewall spacer acts as a protective layer of the RRAM cell and a mask for subsequent patterning of the data storage layer and underlying bottom electrode. The sidewall spacer can be formed by depositing a conformal dielectric layer and subsequently performing an etching process. The etching process removes lateral portions of the conformal dielectric layer and leaves the sidewall spacer along sidewall of the top electrode. Then, the bottom electrode is patterned by vertically removing excess conductive material not covered by the top electrode and/or the sidewall spacer.

As scaling continues to reduce the size of RRAM cells, the bit-to-bit pitch becomes narrower and causes a smaller space between adjacent RRAM cells. The smaller space between adjacent RRAM cells makes forming sidewall spacers more difficult (e.g., sidewall spacers may merge in a narrow trench between adjacent RRAM cells). Since the sidewall spacers provide protection to the RRAM cells, processing problems in forming the sidewall spacers can potentially increase the risk of unwanted exposure of the RRAM cells and thereby damage and/or downgrade the performance of the RRAM cells. Also, relatively thick sidewall spacers may enlarge the size of the RRAM cells.

Accordingly, the present disclosure relates to an improved RRAM device having a relatively small/narrow sidewall spacer and an associated method of formation. In some embodiments, the RRAM device comprises an RRAM cell having a stack including a top electrode and a bottom electrode separated by a resistance switching layer having a variable resistance. The RRAM device further comprises a self-sputtering spacer having a vertical portion and a lateral portion. The vertical portion abuts sidewalls of the resistance switching layer and the top electrode. The lateral portion surrounds the bottom electrode at a position that is vertically disposed between the resistance switching layer and a bottom etch stop layer. The self-sputtering spacer is formed by performing a sputter etching process on a spacer material vertically arranged between the resistance switching layer and a bottom etch stop layer, after patterning the top electrode. The sputter etching process causes dislodged atoms of the spacer material to be re-deposited onto the work piece, thereby forming a relatively small/narrow sidewall spacer. By forming the self-sputtering spacer by the sputter etching process, instead of by depositing a conformal dielectric layer along topology of the work piece and performing an etch to form a sidewall spacer along sidewall of the top electrode and the resistance switching layer, processing problems associated with sidewall spacer formation are eliminated, and a lateral dimension of the RRAM cell can be minimized.

FIG. 1 illustrates a cross-sectional view of an integrated circuit device 100 including an RRAM cell 111 according to some embodiments.

The integrated circuit device 100 comprises a lower interconnect via 102 surrounded by a lower inter-level dielectric (ILD) layer 104 and an upper metal interconnect line 124 abutting an upper ILD layer 120 disposed over a substrate 101. In some embodiments, the lower ILD layer 104 and the upper ILD layer 120 may comprise silicon dioxide ($SiO_2$), a low-k dielectric material, or extreme low-k (ELK) dielectric material. The RRAM cell 111 can be disposed between the lower interconnect via 102 and an upper interconnect via 122 coupled to the upper metal interconnect line 124.

The RRAM cell 111 comprises a bottom electrode 106 and a top electrode 114 separated by a resistance switching layer 110. The bottom electrode 106 and the top electrode 114 may comprise titanium (Ti), tantalum (Ta), titanium nitride (TiN), tantalum nitride (TaN) or one or more layers of other metal composite films. In some embodiments, the bottom electrode 106 may comprise at least two layers of conductive materials. In some embodiments, a diffusion barrier layer (not shown) is disposed between the bottom electrode 106 and the underlying lower interconnect via 102 to prevent contamination and damage to the bottom electrode 106 introduced by diffusion between the lower interconnect via 102 and the bottom electrode 106. In some embodiments, the diffusion barrier layer may comprise, for example, Ta or TaN or a conductive oxide, nitride, or oxynitride of a selected metal. The resistance switching layer 110 comprises a material having a variable resistance configured to undergo a reversible phase change between a high resistance state and a low resistance state. In some embodiments, the resistance switching layer 110 can be a high-k dielectric layer. For example, the resistance switching layer 110 may include a transitional metal oxide comprising one or more layers of hafnium oxide ($HfO_x$), aluminum oxide ($AlO_x$) tantalum oxide ($TaO_x$), or other composite combinations such as hafnium aluminum oxide (HfAlO). In some other embodiments, the resistance switching layer 110 can include one or more layers of carbon-based material, such as carbon nanotube ("CNT") material resistance switching layer The bottom electrode 106 abuts the lower interconnect via 102 and is surrounded by a bottom etch stop layer 108. In some embodiments, the bottom electrode 106 has a width smaller than that of the lower interconnect via 102 disposed underneath. The bottom etch stop layer 108 abuts a peripheral region of the lower interconnect via 102. In some other embodiments, not shown in the figure, the bottom electrode 106 may have a width greater than that of the lower interconnect via 102. In such embodiments, a peripheral region of a bottom surface of the bottom electrode 106 is disposed on the lower ILD layer 104. In some embodiments, the width of the bottom electrode 106 is smaller than that of the resistance switching layer 110 and the top electrode 114.

The RRAM cell 111 further comprises a self-sputtering spacer 132. The self-sputtering spacer 132 includes a lateral portion 132a and a vertical portion 132b. The lateral portion 132a is disposed over the bottom etch stop layer 108 and surrounds the bottom electrode 106. In some embodiments, the lateral portion 132a abuts an upper portion of a sidewall of the bottom electrode 106 and a bottom surface of the resistance switching layer 110. The vertical portion 132b of the self-sputtering spacer 132 surrounds the top electrode 114 and the resistance switching layer 110. In some embodiments, the vertical portion 132b covers sidewalls of the top electrode 114 and the resistance switching layer 110.

The self-sputtering spacer 132 may be formed by way of a self-sputtering process that etches a spacer material to dislodge particles of the spacer material, which are subsequently re-deposited to form the self-sputtering spacer 132. During the self-sputtering process used to form the self-sputtering spacer 132, the top electrode 114 protects a portion of the spacer material from being sputter etched to form the lateral portion 132a of the self-sputtering spacer. Therefore, the sputtering process etches an excessive portion of the spacer material not covered by the top electrode 114. The etched material of the spacer material is then re-deposited on sidewalls of the top electrode 114 and the resistance switching layer 110 to form the vertical portion 132b. Thus, the lateral portion 132a and the vertical portion 132b can be made of same material.

In some embodiments, the self-sputtering spacer 132 comprises dielectric material. For example, the self-sputtering spacer 132 may comprise silicon nitride, tetraethyl orthosilicate (TEOS) or silicon-rich oxide (SRO). The vertical portion 132b can have a lateral thickness d in a range of from about 50 Å to about 150 Å, which can be thinner than previous sidewall spacers. For example, a sidewall spacer formed from conformal dielectrics deposited by CVD or PVD processes may have a thickness over about 200 Å. Notably, the example values given below, for example, thickness, distance or dimensions are under 28 nm fabrication processes, and disclosed integrated circuit and processing methods may also be suitable for other fabrication nodes.

In some embodiments, a hard mask 116 can be disposed on the top electrode 114. The hard mask 116 has a sidewall aligned with a sidewall of the top electrode 114. In some embodiments, the sidewall of the hard mask 116 can also be aligned with the sidewall of the resistance switching layer 110. In some embodiments, the hard mask 116 may comprise silicon oxy-nitride (SiON), silicon dioxide ($SiO_2$), silicon carbide (SiC), silicon-nitride ($SiN_x$), or other composite dielectric films.

A top etch stop layer 118 can be disposed over the bottom etch stop layer 108, and may continuously extend along sidewalls of the vertical portion 132b of the self-sputtering spacer 132 and overlying a top surface of the hard mask 116. In some embodiments, the top etch stop layer 118 can be a conformal layer that abuts the bottom etch stop layer 108 and the self-sputtering spacer. The top etch stop layer 118 separates the top electrode 114 and the resistance switching layer 110 from the upper ILD layer 120 surrounding the upper metal interconnect line 124 and the upper interconnect via 122. The upper interconnect via 122 extends through a hole within the top etch stop layer 118 and is electrically connected to the top electrode 114. In some embodiments, the bottom etch stop layer 108 and the top etch stop layer 118 may respectively comprise a same dielectric material or different dielectric materials such as silicon carbide (SiC), silicon nitride ($SiN_x$), or one or more layers of composite dielectric films.

Figure 2:
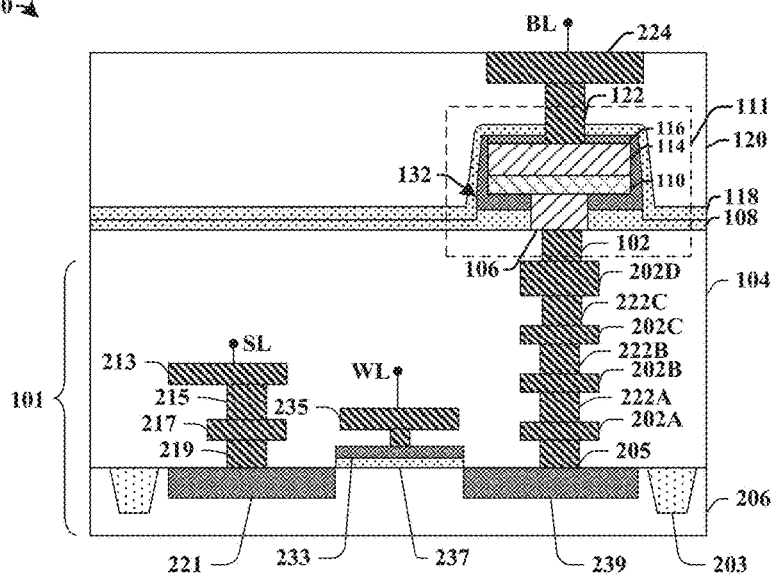
FIG. 2 illustrates a cross-sectional view of some additional embodiments of an integrated circuit device including an RRAM cell.

FIG. 2 illustrates a cross-sectional view of an integrated circuit device 200 including RRAM cell 111.

As shown in FIG. 2, an RRAM cell 111 can be disposed over a substrate 101 comprising a semiconductor substrate 206 having a transistor arranged between isolation regions 203. The transistor includes a source region 221, a drain region 239, a gate electrode 233, and a gate dielectric 237. A source line 213 (SL) is connected to the source region 221 through a contact plug 219, a first metal interconnect line 217, and a first metal via 215, which are disposed within one or more ILD layers 104. A word line (WL) 235 for addressing the RRAM cell 111 is coupled to the gate electrode 233. A bottom electrode 106 of the RRAM cell 111 is connected to the drain region 239 through contact plug 205, first, second, third, and forth metal interconnect lines 202A-202D, metal vias 222A-222C arranged between the metal interconnect lines 202A-202D, and a lower interconnect via 102. An upper interconnect via 122 connects a top electrode 114 of the RRAM cell 111 to a bit line 224 arranged within a fifth metal interconnect layer disposed within an upper ILD layer 120. A resistance switching layer 110 is disposed between the top electrode 114 and the bottom electrode 106. A self-sputtering spacer 132 is disposed under the resistance switching layer 110 and along sidewall of the resistance switching layer 110. A bottom etch stop layer 108 and a top etch stop layer cover outer surfaces of the self-sputtering spacer 132, separating the self-sputtering spacer 132 from an upper ILD layer 120.

In some embodiments, a diffusion barrier layer (not shown) is disposed between the bottom electrode 106 and the underlying lower interconnect via 102. The diffusion barrier layer is configured to prevent contamination and damage to the bottom electrode 106 introduced by diffusion between the lower interconnect via 102 and the bottom electrode 106. In some embodiments, the diffusion barrier layer may comprise, for example, Ta or TaN or a conductive oxide, nitride, or oxynitride of a selected metal.

In most embodiments, the integrated circuit device 200 uses a 1T1R (one transistor, one resistor) RRAM device structure as shown in FIG. 2. However, it will be appreciated that in other embodiments the RRAM cell 111 can be applied with other RRAM device structures (e.g., a 2T2R). Also, the source line 213, the word line 235, and the bit line 224 can be located in different layers than shown in this example.

In some embodiments, the bottom electrode 106 has a cubic shape with width smaller than that of the top electrode 114. In some other embodiments, the bottom electrode 106 may have a curved bottom surface and/or upper surface, such as a concave surface corresponding to the opening within the bottom etch stop layer where the bottom electrode is filled in. The bottom electrode 106 may comprise several metal layers. The self-sputtering spacer 132 may abut sidewalls of the top electrode and the resistance switching layer that are vertically aligned. The self-sputtering spacer 132 may also abut a bottom surface of the resistance switching layer 110. The self-sputtering spacer 132 may also abut an upper surface of the bottom etch stop layer 108. The self-sputtering spacer 132 may also abut a sidewall of a hard mask 116 disposed over the top electrode 114, having lateral dimensions aligned with the top electrode 114. The hard mask 116 is configured to pattern the top electrode 114.

Figure 3:
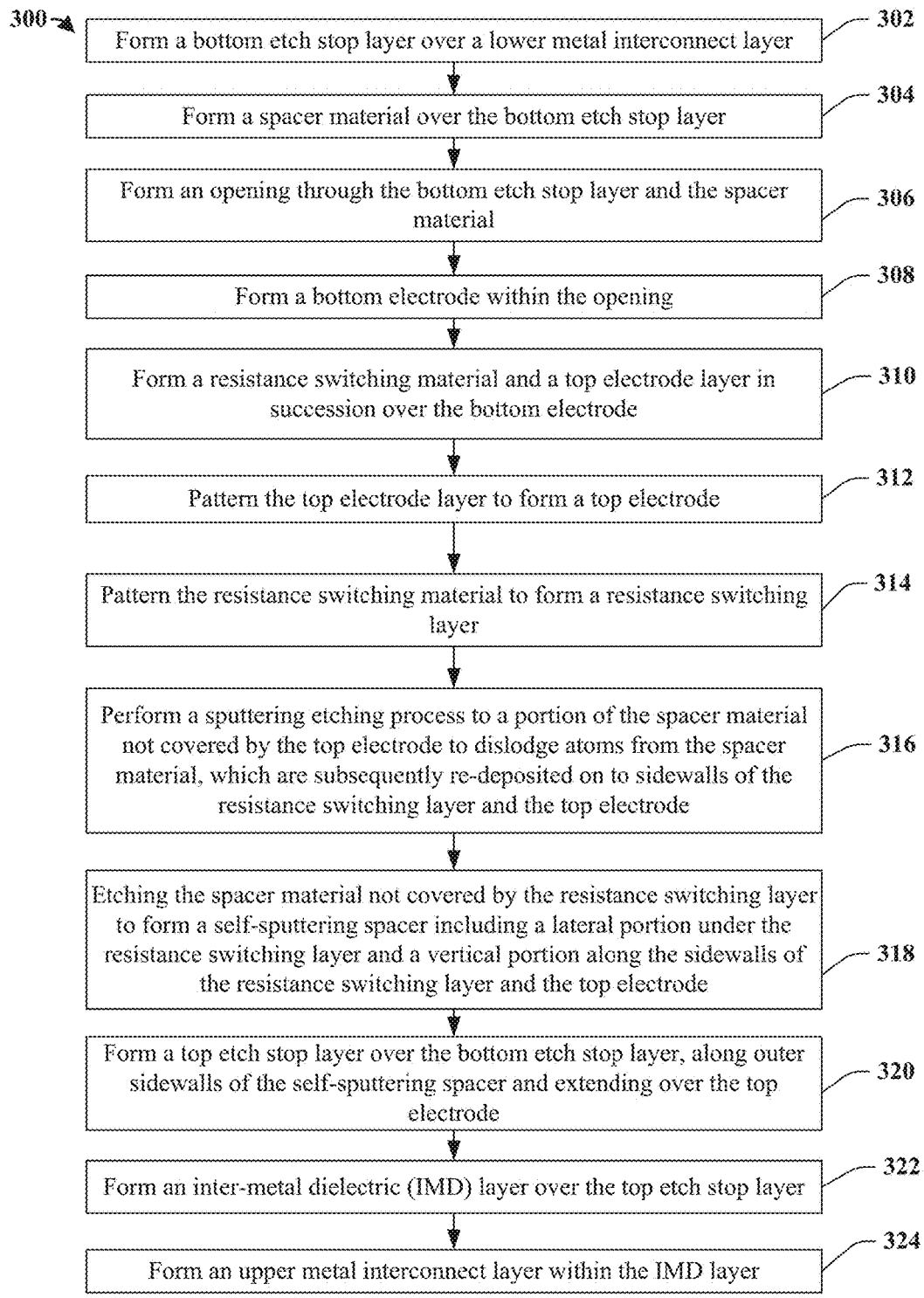
FIG. 3 illustrates a flow diagram of some embodiments of a method of forming an integrated circuit device including an RRAM cell.

FIG. 3 illustrates a flow diagram of some embodiments of a method 300 of forming an integrated circuit device including an RRAM cell.

While disclosed method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a bottom etch stop layer is formed over a lower metal interconnect layer.

At 304, a spacer material is formed over the bottom etch stop layer.

At 306, an opening is formed through the bottom etch stop layer and the spacer material to a position overlying the lower metal interconnect layer.

At 308, a bottom electrode is formed within the opening. The bottom electrode may be formed by depositing one or more conductive layers followed by a planarization process such as chemical-mechanical polishing.

At 310, a resistance switching material and a top electrode layer are formed in succession over the bottom electrode.

At 312, the top electrode layer is patterned to form a top electrode. In some embodiments, a hard mask overlying the top electrode layer is patterned first.

At 314, the resistance switching material is patterned to form a resistance switching layer. In some embodiments, the top electrode and the resistance switching layer have vertically aligned sidewalls.

At 316, a sputter etching process is performed to a portion of the spacer material not covered by the top electrode or resistance switching layer. The self-sputtering process dislodges atoms from the spacer material, which are subsequently re-deposited on to sidewalls of the resistance switching layer and the top electrode. The re-deposited atoms are from the spacer material At 318, a remaining portion of the spacer material not covered by the resistance switching layer form a self-sputtering spacer including a lateral portion under the resistance switching layer and a vertical portion along the sidewalls of the resistance switching layer and the top electrode.

At 320, a top etch stop layer is formed over the bottom etch stop layer, along outer sidewalls of the self-sputtering spacer and extending over the top electrode.

At 322, an inter-metal dielectric (IMD) layer is formed over the top etch stop layer.

At 324, an upper metal via and an upper interconnect metal layer are formed over the top etch stop layer within the IMD layer. The upper metal via is disposed through the top etch stop layer and connected to the top electrode.

FIGS. 4-14 illustrate some embodiments of cross-sectional views showing a method of forming an integrated circuit device including an RRAM cell. Although FIGS. 4-14 are described in relation to method 300, it will be appreciated that the structures disclosed in FIGS. 4-14 are not limited to such a method, but instead may stand alone as structures independent of the method.

Figure 4:
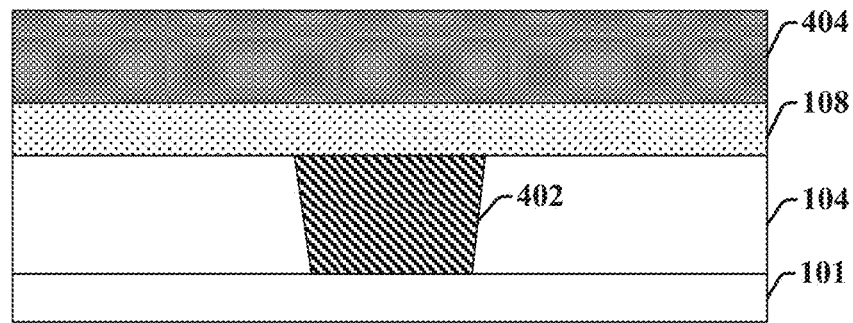
FIGS. 4-14 illustrate cross-sectional views of some embodiments showing manufacturing processes of a method of forming an integrated circuit device including an RRAM cell.

FIG. 4 illustrates some embodiments of a cross-sectional view 400 corresponding to acts 302 and 304.

As shown in cross-sectional view 400, a lower metal interconnect layer 402 is formed within a lower ILD layer 104 overlying a substrate 101. In some embodiments, the lower metal interconnect layer 402 may be disposed within a back-end-of-the-line (BEOL) metal interconnect stack. The lower metal interconnect layer 402 can be a lower metal via or lower metal line.

Corresponding to act 302, a bottom etch stop layer 108 is formed over the lower metal interconnect layer 402 and the lower ILD layer 104. In some embodiments, the bottom etch stop layer 108 may comprise silicon-nitride (SiN), silicon-carbide (SiC), or a similar composite dielectric film. In some embodiments, the bottom etch stop layer 108 may be formed by a vapor deposition technique (e.g., physical vapor deposition, chemical vapor deposition, etc.). In some embodiments, the lower metal interconnect layer 402 may be formed by selectively etching the lower ILD layer 104 (e.g., an oxide, a low-k dielectric, or an ultra low-k dielectric) to form an opening in the lower ILD layer 104. A metal (e.g., copper, aluminum, etc.) is then deposited to fill the opening, and a planarization process is performed to remove excess metal to form the lower metal interconnect layer 402.

Corresponding to act 304, a spacer material 404 is formed over the bottom etch stop layer 108. In some embodiments, the spacer material 404 may comprise silicon nitride, tetra-ethyl orthosilicate (TEOS), silicon-rich oxide (SRO), or a similar composite dielectric film. In some embodiments, the spacer material 404 may be formed by a vapor deposition technique (e.g., physical vapor deposition, chemical vapor deposition, etc.).

Figure 5:
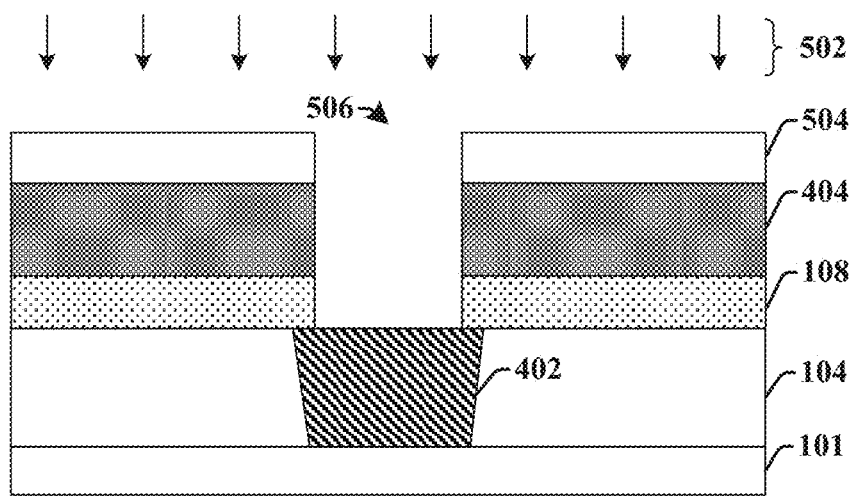

FIG. 5 illustrates some embodiments of a cross-sectional view 500 corresponding to act 306.

As shown in cross-sectional view 500, an opening 506 is formed through the bottom etch stop layer 108 and the spacer material 404 to a position overlying the lower metal interconnect layer 402. In some embodiments, a photoresist mask 504 is firstly formed over the bottom etch stop layer 108 and the spacer material 404 with an opening corresponding to the opening 506 to be formed. Then, the workpiece is exposed to an etchant 502 that removes an exposed portion of the bottom etch stop layer 108 and the spacer material 404 not covered by the photoresist mask 504. In some embodiments, the opening 506 can be formed through a dry etch process such as a plasma etching. By adjusting powers and flow rate of reactant gases used in the plasma etching, contours of the opening 506 can be controlled. In some embodiments, a tapered or curved sidewall can be formed to facilitate subsequent reliable filling of the opening 506 with a conductive material. The opening 506 may have a width closer to or smaller than a width of the lower metal interconnect layer 402.

Figure 6:
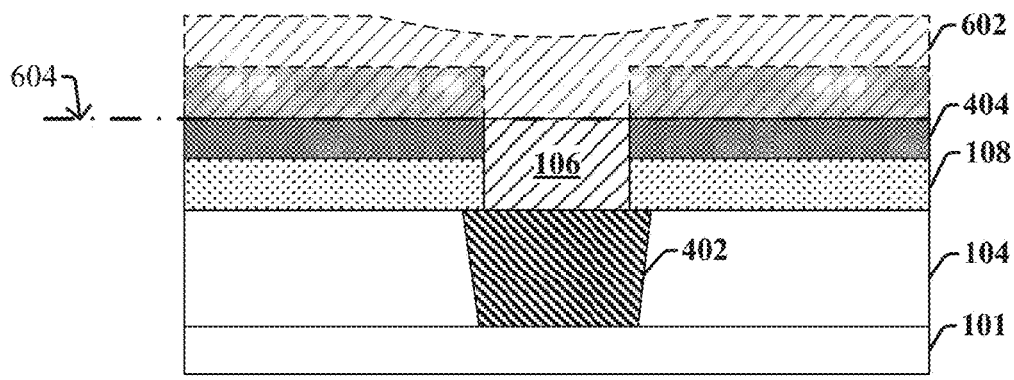

FIG. 6 illustrates some embodiments of a cross-sectional view 600 corresponding to act 308.

As shown in cross-sectional view 600, the photoresist mask (504 of FIG. 5) is removed and a bottom electrode layer 602 is formed within the opening 506 and extending over the bottom etch stop layer 108. A diffusion barrier layer (not shown) may be deposited on the lower metal interconnect layer 402 and along the sidewall of the opening 506 prior to deposition of the bottom electrode layer 602 to prevent diffusion between the lower metal interconnect layer 402 and the bottom electrode layer 602. The bottom electrode layer 602 may be formed by depositing one or more conductive layers followed by a planarization process such as chemical-mechanical polishing. In various embodiments, the bottom electrode layer 602 may comprise a metal nitride (e.g., titanium nitride (TiN) or tantalum nitride (TaN) or a metal (e.g., titanium (Ti) or tantalum (Ta)). In some embodiments, a planarization process, such as chemical-mechanical polishing process, can be performed after the deposition of the bottom electrode layer 602 to form a planar surface along line 604. A bottom electrode 106 is defined, having an upper surface aligned with that of the bottom etch stop layer 108.

Figure 7:
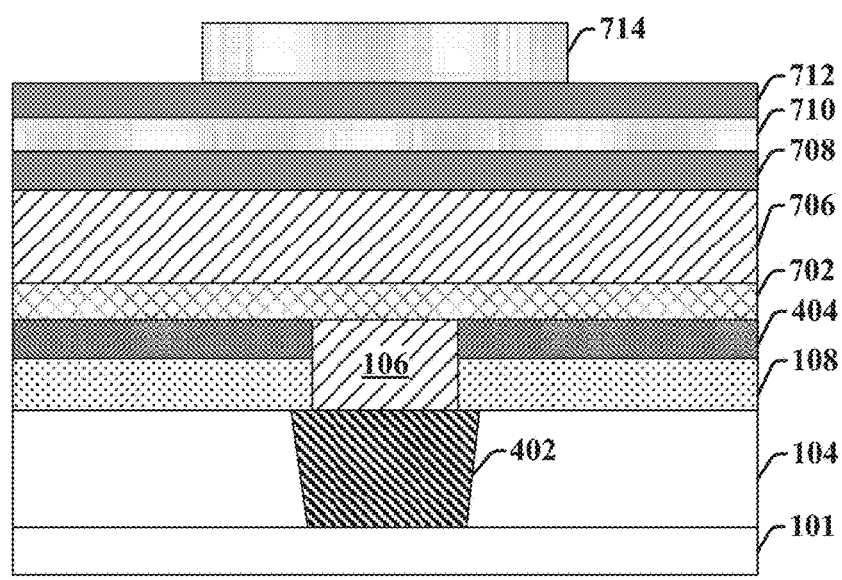

FIG. 7 illustrates some embodiments of a cross-sectional view 700 corresponding to act 310.

As shown in cross-sectional view 700, a resistance switching material 702 and a top electrode layer 706 are formed in succession over the bottom electrode 106 and the spacer material 404. In some embodiments, a hard mask layer and/or a photoresist layer may be subsequently formed on the top electrode layer 706 to facilitate the patterning of the RRAM cell. For example, as shown in FIG. 7, a hard mask layer 708, a photoresist layer 710, an additional hard mask 712, and an additional photoresist material 714 are formed in succession over the top electrode layer 706.

In some embodiments, the hard mask layer 708 may comprise oxygen containing dielectric, such as silicon-oxide ($SiO_2$) or silicon-oxynitride (SiON). In other embodiments, the hard mask layer 708 may comprise a hard mask layer that is substantially devoid of oxygen, such as silicon-nitride (SiN) silicon-carbide (SiC), or a composite dielectric film that is substantially devoid of oxygen. In some embodiments, the resistance switching material 702 may comprise one or more layers of carbon-based material, such as carbon nanotube ("CNT") material. In some other embodiments, the resistance switching material 702 may comprise a high-k dielectric material having a variable resistance. For example, in some embodiments, the resistance switching material 702 may comprise metal oxide composite such as hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$) as in its relative high resistance state and a metal such as titanium (Ti), hafnium (Hf), platinum (Pt), ruthenium (Ru), and/or aluminum (Al) as in its relative low resistance state. In some embodiments, the top electrode layer 706 may comprise a metal nitride (e.g., titanium nitride (TiN) or tantalum nitride (TaN) or a metal (e.g., titanium (Ti) or tantalum (Ta)).

Figure 8:
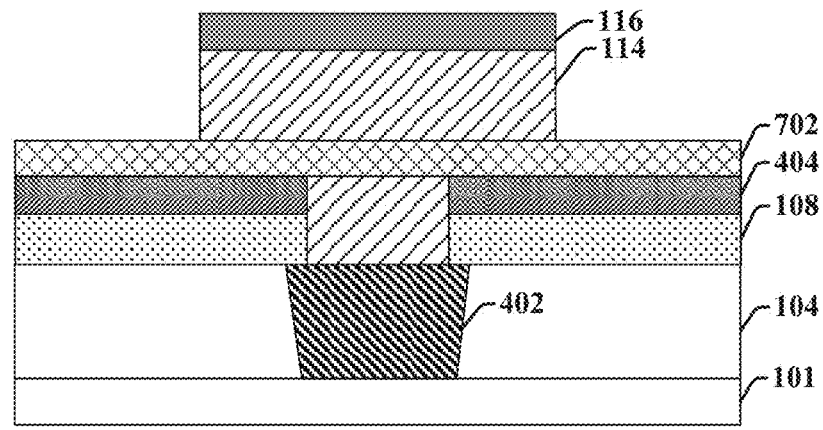

FIG. 8 illustrates some embodiments of a cross-sectional view 800 corresponding to act 312.

As shown in cross-sectional view 800, the top electrode layer 706 are patterned to form a top electrode 114 using a hard mask 116 patterned from the hard mask layer 708. The top electrode 114 and the hard mask 116 have vertically aligned sidewalls. In some embodiments, the top electrode 114 may be patterned by a dry etching process 802. In some embodiments, the dry etching process 802 may comprise an etchant chemistry having gases including $CF_4$, $CH_2F_2$, $Cl_2$, $BCl_3$ and/or other chemicals. In some embodiments, the resistance switching material 702 may act as an etch stop layer to the dry etching process 802 with a lower etch rate relative to the top electrode layer 706.

Figure 9:
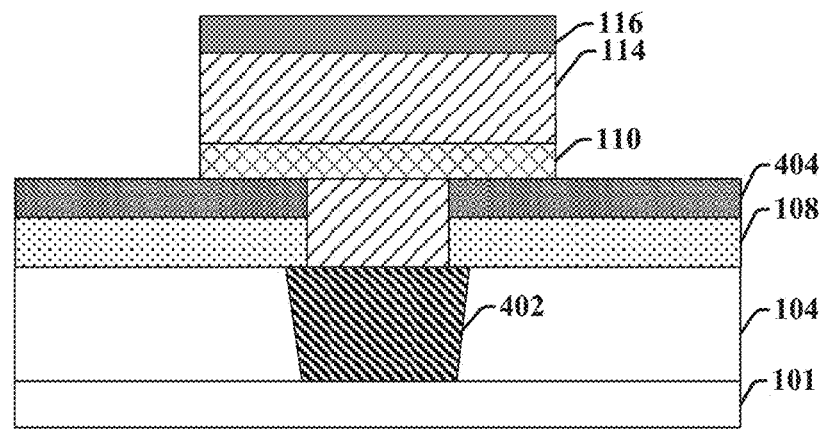

FIG. 9 illustrates some embodiments of a cross-sectional view 900 corresponding to act 314.

As shown in cross-sectional view 900, an etching process 902 is performed to form a resistance switching layer 110. In some embodiments, the dry etching process 902 may comprise an etchant chemistry having gases including $CF_4$, $CH_2F_2$, $Cl_2$, $BCl_3$ and/or other chemicals. In some other embodiments, the etching process 902 may be a sputtering etching process using argon (Ar) as one of energetic particles.

Figure 10:
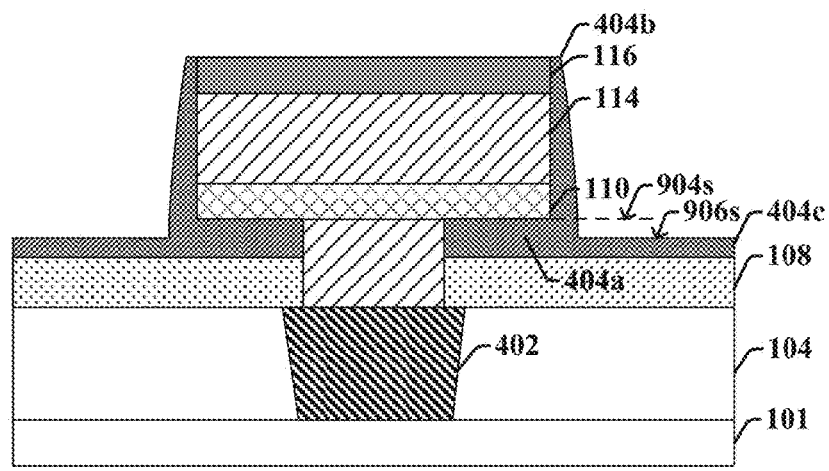

FIG. 10 illustrates some embodiments of a cross-sectional view 1000 corresponding to act 316.

As shown in cross-sectional view 1000, a sputter etching process 1002 is performed on an excessive portion 404c of the spacer material not covered by the top electrode 114. An upper surface of the excessive portion 404c is lowered from an original plane 904s to a new plane 906s. In some embodiments, an argon (Ar) plasma is used by the sputter etching process 1002. The sputter etching process 1002 dislodges atoms from the spacer material 404, which are subsequently re-deposited to a sidewall of the top electrode 114. In some embodiments, the resistance switching material 702 is patterned by the sputtering process before the sputtering process is performed to the spacer material 404, for example, when the resistance switching material 702 comprises carbon-contained material. In other embodiments, the resistance switching material 702 is patterned by other dry etching processes. The spacer material 404 can be re-deposited on a sidewall of the formed resistance switching layer 110 as well, forming a vertical portion 404b along the sidewalls of the top electrode 114 and the resistance switching layer 110. A lateral portion 404a is substantially un-altered since it is covered by the top electrode 114 and the resistance switching layer 110.

Figure 11:
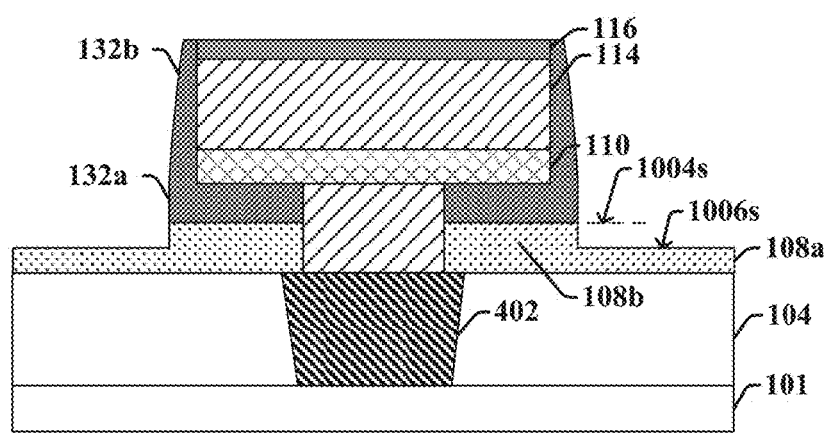

FIG. 11 illustrates some embodiments of a cross-sectional view 1100 corresponding to act 318.

As shown in cross-sectional view 1100, the excessive portion 404c of the spacer material is removed by an etching process 1102 to form a self-sputtering spacer 132 including a lateral portion 132a under the resistance switching layer 110 and a vertical portion 132b along the sidewalls of the resistance switching layer 110 and the top electrode 114. An upper part of an exposed portion 108a of the bottom etch stop layer 108 not covered by resistance switching layer the self-sputtering spacer 132 may be removed, so that a top surface of the exposed portion 108a may be lowered from a first plane 1004s to a second plane 1006s by the etching process 1002. A covered portion 108b is substantially non-altered. Thus, the covered portion 108b may have thickness greater than that of the exposed portion 108a.

In some embodiments, the etching process 1102 may use etchant having an etchant chemistry comprising $CF_4$, $CH_2F_2$ and/or other chemicals. In some embodiments, the etching processes 802, 902, 1002 and 1102 can be performed in-situ, in other words, within a same reactant chamber held under vacuum to avoid contamination or oxidation. In such embodiments, different reactive conditions can be applied. By performing the etch processes in-situ, the top electrode 114 and the self-sputtering spacer 132 are formed within a single processing step (i.e., a process performed without removing a work piece from a reactant chamber), which can reduce processing costs in comparison to manufacturing procedures in which the top and bottom electrodes are patterned separately and interrupted by sidewall spacer deposition. Furthermore, extra thermal effects caused by previous sidewall spacer formation can be avoided.

Figure 12:
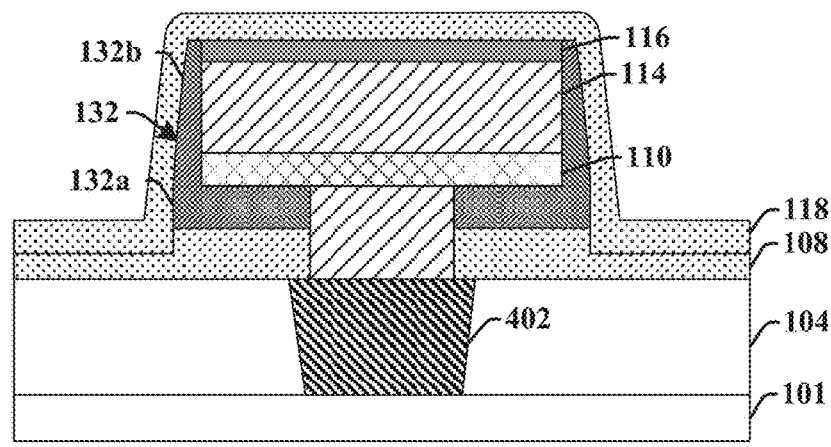

FIG. 12 illustrates some embodiments of a cross-sectional view 1200 corresponding to act 320.

As shown in cross-sectional view 1200, a top etch stop layer 118 is formed over the bottom etch stop layer 108, along outer sidewalls of the self-sputtering spacer 132. The top etch stop layer 118 extends over the top electrode 114. In some embodiments, the top etch stop layer 118 can be a dielectric layer conformal formed onto the work piece.

Figure 13:
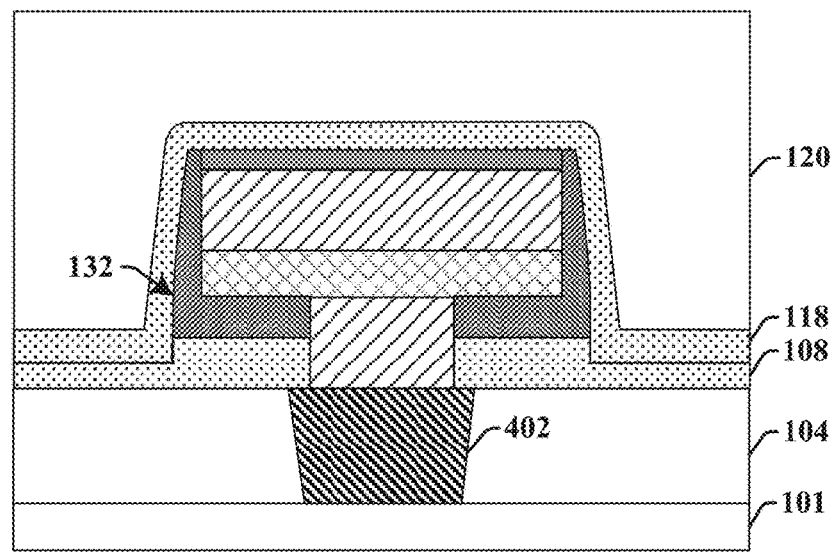

FIG. 13 illustrates some embodiments of a cross-sectional view 1300 corresponding to act 322.

As shown in cross-sectional view 1300, an upper ILD layer 120 is formed over the top etch stop layer 118. In some embodiments, the upper ILD layer 120 may comprise an oxide layer, a low-k dielectric layer, or an ultra-low-k dielectric layer formed by a deposition process (e.g., CVD, PECVD, PVD, etc.)

Figure 14:
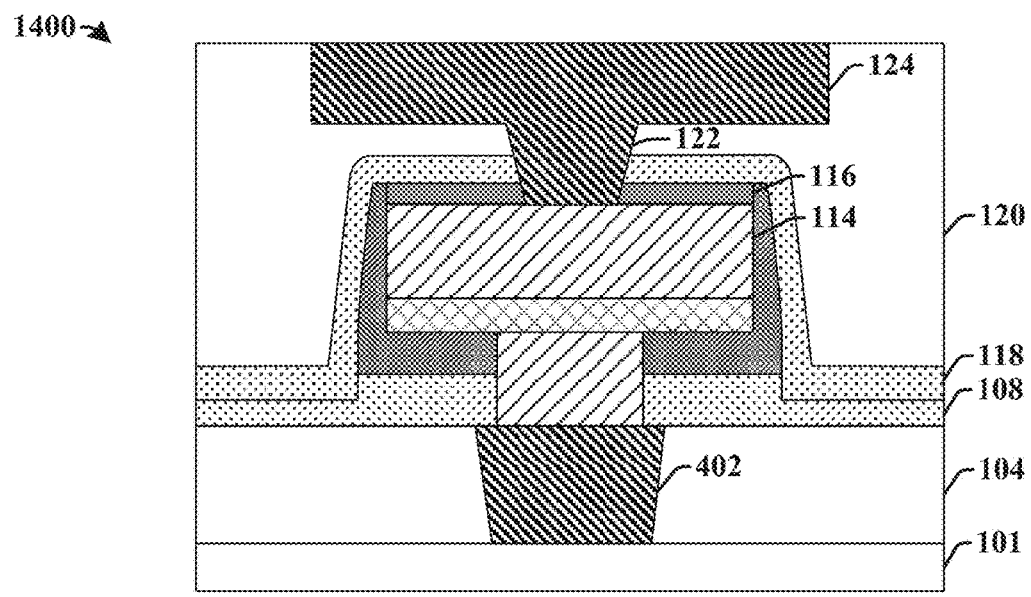

FIG. 14 illustrates some embodiments of a cross-sectional view 1400 corresponding to act 324.

As shown in cross-sectional view 1400, an upper interconnect via 122 and an upper metal interconnect line 124 are formed over the top etch stop layer 118 within the upper ILD layer 120. In some embodiments, the upper interconnect via 122 may be formed by etching the upper ILD layer 120 to form an opening that extends through the upper ILD layer 120, the top etch stop layer 118, and the hard mask 116 to the top electrode 114. The opening is then filed with a conductive material (e.g., copper) to form an upper interconnect via 122, which extends from a top surface of the top electrode 114 to an upper metal wire (not shown).

Therefore, the present disclosure relates to an integrated circuits device having an RRAM cell, and an associated method of formation. The RRAM cell of the integrated circuits comprises a bottom electrode and a top electrode separated by a resistance switching layer. The RRAM cell further comprises a self-sputtering spacer comprising a lateral portion surrounding the bottom electrode and a vertical portion disposed along sidewalls of the resistance switching layer and the top electrode. The self-sputtering spacer is formed by sputtering an excessive portion of a spacer material which is not covered by the top electrode and the resistance switching layer. The spacer material is previously formed over a bottom etch stop layer. In some embodiments, the sputtering process patterns the resistance switching layer according to the top electrode before sputtering the spacer material.

In some embodiments, the present disclosure relates to integrated circuit device. The integrated circuit device comprises a bottom electrode overlying a lower inter-level dielectric (ILD) layer and a bottom etch stop layer laterally surrounding the bottom electrode. The integrated circuit device further comprises a resistance switching layer having a variable resistance, which is disposed over the bottom electrode and a top electrode disposed over the resistance switching layer. The integrated circuit device further comprises a self-sputtering spacer having a lateral portion that surrounds the bottom electrode at a position that is vertically disposed between the resistance switching layer and the bottom etch stop layer and a vertical portion abutting sidewalls of the resistance switching layer and the top electrode. The integrated circuit device further comprises a top etch stop layer disposed over the bottom etch stop layer along sidewalls of the self-sputtering spacer and extending over a top surface of the top electrode.

In some other embodiments, the present disclosure relates to an integrated circuit device. The integrated circuit device comprises a substrate comprising a transistor with source and drain regions, a lower metal interconnect layer disposed over the substrate and surrounded by a lower inter-level dielectric (ILD) layer, a resistive random access memory (RRAM) cell disposed over the lower metal interconnect layer and an upper metal interconnect layer disposed over the RRAM cell and surrounded by an upper inter-level dielectric (ILD) layer. The lower metal interconnect layer is electrically coupled to the drain region of the transistor through a series of contacts and vias. The RRAM cell comprises a bottom electrode electrically coupled to the lower metal interconnect layer, a resistance switching layer disposed on the bottom electrode, and a top electrode disposed on the resistance switching layer and electrically coupled to the upper metal interconnect layer. The RRAM cell comprises further comprises a self-sputtering spacer having a lateral portion surrounding the bottom electrode and a vertical portion covering sidewalls of the resistance switching layer and the top electrode.

In yet other embodiments, the present disclosure relates to an integrated circuit device. The integrated chip comprises a substrate, and a lower metal interconnect layer disposed over the substrate, and surrounded by a lower inter-level dielectric (ILD) layer. The integrated chip further comprises a bottom electrode disposed directly above lower metal interconnect layer, a bottom etch stop layer laterally surrounding the bottom electrode, a resistance switching layer having a variable resistance and disposed over the bottom electrode, and a top electrode disposed over the resistance switching layer. The integrated chip further comprises a self-sputtering spacer having a lateral portion that surrounds the bottom electrode at a position that is vertically disposed between the resistance switching layer and the bottom etch stop layer and a vertical portion abutting sidewalls of the resistance switching layer and the top electrode. The integrated chip further comprises a top etch stop layer disposed over the bottom etch stop layer along sidewalls of the self-sputtering spacer and extending over a top surface of the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
   a bottom electrode overlying a lower inter-level dielectric (ILD) layer;
   a bottom etch stop layer laterally surrounding the bottom electrode;
   a resistance switching layer having a variable resistance, which is disposed over the bottom electrode;
   a top electrode disposed over the resistance switching layer;
   a self-sputtering spacer having a lateral portion that surrounds the bottom electrode at a position that is vertically disposed between the resistance switching layer and the bottom etch stop layer and a vertical portion abutting sidewalls of the resistance switching layer and the top electrode; and
   a top etch stop layer disposed over the bottom etch stop layer along sidewalls of the self-sputtering spacer and extending over a top surface of the top electrode;
   wherein the self-sputtering spacer contacts an upper sidewall of the bottom electrode.

2. The integrated circuit device of claim 1, wherein the self-sputtering spacer has a thickness in a range of from about 50 Å to about 150 Å.

3. The integrated circuit device of claim 1, wherein the self-sputtering spacer comprises tetraethyl orthosilicate (TEOS) or silicon-rich oxide (SRO).

4. The integrated circuit device of claim 1, wherein the bottom electrode has a planar surface and a width smaller than that of the top electrode.

5. The integrated circuit device of claim 1, further comprising:
   a lower metal interconnect layer and a first via disposed thereon, wherein the lower metal interconnect layer and the first via are surrounded by the lower ILD layer, and wherein the bottom electrode abuts the first via.

6. The integrated circuit device of claim 1, wherein the self-sputtering spacer further abuts a top surface of the bottom etch stop layer and a bottom surface of the resistance switching layer.

7. The integrated circuit device of claim 1, further comprising:
   a hard mask disposed between the top electrode and the top etch stop layer and having a sidewall vertically aligned with sidewalls of the top electrode and the resistance switching layer; and
   a second via extending through the top etch stop layer, the hard mask, and abutting an upper surface of the top electrode.

8. The integrated circuit device of claim 1, wherein the lateral portion and the vertical portion of the self-sputtering spacer are made of a same material.

9. The integrated circuit device of claim 1, wherein the bottom electrode comprises titanium (Ti), tantalum (Ta), titanium nitride (TiN), or tantalum nitride (TaN).

10. The integrated circuit device of claim 1, wherein the resistance switching layer comprises carbon nanotube (CNT) material.

11. The integrated circuit device of claim 1, wherein the top and bottom etch stop layers comprises silicon carbide (SiC) or silicon nitride.

12. An integrated circuit device, comprising:
    a substrate comprising a transistor with a source region and a drain region;
    a lower metal interconnect layer disposed over the substrate, surrounded by a lower inter-level dielectric (ILD) layer, and electrically coupled to the drain region of the transistor through a series of contacts and vias;
    an upper metal interconnect layer disposed over the lower metal interconnect layer and surrounded by an upper inter-level dielectric (ILD) layer; and
    a resistive random access memory (RRAM) cell disposed between the lower and upper metal interconnect layers, comprising:
       a bottom electrode electrically coupled to the lower metal interconnect layer,
       a resistance switching layer disposed on the bottom electrode,
       a top electrode disposed on the resistance switching layer and electrically coupled to the upper metal interconnect layer, and
       a self-sputtering spacer having a lateral portion surrounding the bottom electrode and a vertical portion covering sidewalls of the resistance switching layer and the top electrode;
       wherein the self-sputtering spacer is recessed back toward the bottom electrode from a sidewall of the resistance switching layer.

13. The integrated circuit device of claim 12, further comprising:
    a first via electrically coupling the bottom electrode and the lower metal interconnect layer;
    a second via electrically coupling the top electrode and the upper metal interconnect layer;
    a bottom etch stop layer disposed between the self-sputtering spacer and the lower ILD layer; and
    a top etch stop layer disposed over the bottom etch stop layer, along an outer sidewall of the self-sputtering spacer and overlying the top electrode.

14. The integrated circuit device of claim 12, wherein the upper metal interconnect layer is electrically connected to a bit line.

15. The integrated circuit device of claim 12, wherein the self-sputtering spacer abuts sidewalls of the top electrode and the resistance switching layer and a bottom surface of the resistance switching layer.

16. An integrated circuit device, comprising:
    a substrate;
    a lower metal interconnect layer disposed over the substrate, and surrounded by a lower inter-level dielectric (ILD) layer;
    a bottom electrode disposed directly above the lower metal interconnect layer;

a bottom etch stop layer laterally surrounding the bottom electrode;

a resistance switching layer having a variable resistance and disposed over the bottom electrode;

a top electrode disposed over the resistance switching layer;

a self-sputtering spacer having a lateral portion that surrounds the bottom electrode at a position that is vertically disposed between the resistance switching layer and the bottom etch stop layer and a vertical portion abutting sidewalls of the resistance switching layer and the top electrode; and a top etch stop layer disposed over the bottom etch stop layer along sidewalls of the self-sputtering spacer and extending over a top surface of the top electrode;

wherein the self-sputtering spacer separates a bottom surface of the resistance switching layer from a top surface of the bottom etch stop layer.

17. The integrated circuit device of claim 16, wherein the self-sputtering spacer comprises tetraethyl orthosilicate (TEOS) or silicon-rich oxide (SRO).

18. The integrated circuit device of claim 16, wherein sidewalls of the top electrode and the resistance switching layer are vertically aligned, and a sidewall of the bottom electrode is recessed back from the sidewalls of the top electrode and the resistance switching layer.

19. The integrated circuit device of claim 16, wherein the self-sputtering spacer further abuts a top surface of the bottom etch stop layer, an upper sidewall of the bottom electrode, and a bottom surface of the resistance switching layer.

20. The integrated circuit device of claim 16, further comprising:

an upper metal interconnect layer surrounded by an upper inter-level dielectric (ILD) layer; and a via electrically disposed through the top etch stop layer and coupling the top electrode to the upper metal interconnect layer.

* * * * *